US006951809B2

(12) United States Patent
Tarumi et al.

(10) Patent No.: US 6,951,809 B2
(45) Date of Patent: Oct. 4, 2005

(54) METHOD FOR MANUFACTURING SEMICONDUCTOR DEVICE

(75) Inventors: Nobuaki Tarumi, Osaka (JP); Atsushi Ikeda, Niigata (JP); Takenobu Kishida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 53 days.

(21) Appl. No.: 10/613,048

(22) Filed: Jul. 7, 2003

(65) Prior Publication Data

US 2004/0018722 A1 Jan. 29, 2004

(30) Foreign Application Priority Data

Jul. 25, 2002 (JP) ....................................... 2002-216458

(51) Int. Cl.[7] ............................................ H01L 21/4763

(52) U.S. Cl. ....................... 438/627; 438/643; 438/653; 438/685; 438/687; 438/696

(58) Field of Search ................................ 438/627, 628, 438/643, 653, 685, 687, 694–696, 707, 763

(56) References Cited

U.S. PATENT DOCUMENTS 5,933,753 A * 8/1999 Simon et al. ............... 438/629
6,451,177 B1 * 9/2002 Gopalraja et al. ..... 204/192.12
6,498,091 B1 * 12/2002 Chen et al. ................. 438/627

FOREIGN PATENT DOCUMENTS

JP 2001-284449 10/2001

* cited by examiner

*Primary Examiner*—Asok Kumar Sarkar
(74) *Attorney, Agent, or Firm*—McDermott Will & Emery LLP

(57) ABSTRACT

A lower barrier layer made of tantalum nitride having a thickness of approximately 25 nm is deposited by sputtering on a fourth insulating film inclusive of the sidewall surfaces and the bottom surfaces of a via hole and an upper-interconnect-forming groove. The sputtering is performed under the conditions where approximately 10 kW of DC source power is applied to a target. Thereafter, the DC source power is reduced to approximately 2 kW, and approximately 200 W of RF power is applied to a semiconductor substrate. Here, the lower barrier layer is subjected to a sputter-etching process employing argon gas at an etching amount of approximately 5 nm, so that a part of the lower barrier layer deposited on the bottom surface of the via hole is at least partially deposited on the lower part of the sidewall surface of the via hole.

14 Claims, 10 Drawing Sheets

METHOD FOR MANUFACTURING SEMICONDUCTOR DEVICE

BACKGROUND OF THE INVENTION

The present invention relates to a method for manufacturing a semiconductor device including metal interconnects, and more particularly to a method for manufacturing a semiconductor device including metal interconnects by using a dual damascene method.

In recent years, miniaturization and multilayering of interconnects have been advanced for the purpose of achieving higher packing densities of semiconductor devices.

Hereinafter, a known method of forming multilayer metal interconnects for a semiconductor device will be described with reference to the drawings.

FIGS. 7A through 7C, 8A, and 8B illustrate the known method for manufacturing a semiconductor device, wherein respective cross-sectional structures of part of multilayer interconnects including a via hole are shown in the order of process steps.

Initially, as shown in FIG. 7A, a first insulating film 101 and a second insulating film 102 each made of silicon oxide or the like are successively deposited on a semiconductor substrate (not shown). Subsequently, a lower-interconnect-forming groove is formed in a predetermined region of the second insulating film 102. A first barrier film 103 made of tantalum nitride and a second barrier film 104 made of tantalum are formed in the formed lower-interconnect-forming groove, and a lower interconnect 105 made of copper is then formed to fill in the lower-interconnect-forming groove with the first and second barrier films 103 and 104 interposed therebetween. Thereafter, a third insulating film 106 made of silicon nitride, a fourth insulating film 107 made of silicon oxide and a fifth insulating film 108 are successively deposited. Subsequently, an upper-interconnect-forming groove 108*a* is formed in a region of the fifth insulating film 108 above the lower interconnect 105. Then, a via hole 107*a* exposing the lower interconnect 105 is selectively formed in regions of the third and fourth insulating films 106 and 107 below the upper-interconnect-forming groove 108*a*.

Next, as shown in FIG. 7B, a first barrier film 109 made of tantalum nitride and a second barrier film 110 made of tantalum are successively deposited on the fifth insulating film 108 over the whole area inclusive of the bottom surfaces and the sidewall surfaces of the via hole 107*a* and the upper-interconnect-forming groove 108*a*, by sputtering or the like.

Next, as shown in FIG. 7C, a plating seed layer 111 made of copper is deposited on the second barrier film 110 over the whole area inclusive of the bottom surfaces and the sidewall surfaces of the via hole 107*a* and the upper-interconnect-forming groove 108*a*, by sputtering or the like. Thereafter, as shown in FIG. 8A, an upper-interconnect-forming layer 112A made of copper is buried in the via hole 107*a* and the upper-interconnect-forming groove 108*a* by electroplating.

Next, as shown in FIG. 8B, part of the upper-interconnect-forming layer 112A deposited on the fifth insulating film 108 is removed by a chemical mechanical polishing method or the like, and the resultant upper surface is planarized, thereby forming an upper interconnect 112B and a via 112C from the upper-interconnect-forming layer 112A. Thereafter, a sixth insulating film 113 is deposited on the planarized fifth insulating film 108 and the upper interconnect 112B.

However, when miniaturization in the interconnect is further advanced, the known method for manufacturing a semiconductor device makes it difficult to bury the upper-interconnect-forming layer 112A in the via hole 107*a* by plating.

More particularly, the aspect ratio of the via hole 107*a* (the ratio of the depth to the aperture) becomes larger with miniaturization in the interconnect. Therefore, in each of the cases of depositing the first barrier film 109, the second barrier film 110 and the plating seed layer 111 on the via hole 107*a*, sputter atoms are required to have improved linearity (anisotropy).

On the other hand, when the linearity of the sputter atoms is increased, as shown in a sputtering step of FIG. 9A, every one of the first barrier film 109, the second barrier film 110 and the plating seed layer 111 is not sufficiently deposited on the lower part of the sidewall surface of the via hole 107*a*, resulting in these films and this layer being thinned. Especially, when the thickness of each of the first barrier film 109 and the second barrier film 110 is small, copper atoms constituting the plating seed layer 111 cohere so that the film to be formed may be non-uniform or discontinuous. Consequently, as shown in a plating step of FIG. 9B, the via hole 107*a* is not filled in with the upper-interconnect-forming layer 112A, and therefore a cavity-shaped defect called a void or a seam 107*b* is produced.

In this way, when the upper-interconnect-forming layer 112A is not surely buried in the via hole 107*a*, the resistance of each of the via 112C and interconnects 105 and 112B is increased, or electro-migration or stress migration occurs, resulting in significantly reduced reliability of the multilayer interconnects.

To cope with this, if the thickness of each of the first barrier film 109, the second barrier film 110 and the plating seed layer 111 is increased, as shown in a sputtering step of FIG. 10A, an overhang portion 111*a* formed at the upper end of the opening of the via hole 107*a* becomes larger. As a result, in a plating step of FIG. 10B, the almost whole internal part of the via hole 107*a* forms a seam 107*c*.

SUMMARY OF THE INVENTION

The present invention has been made to solve the aforementioned problem, and an object of the present invention is to realize metal interconnects with excellent filling characteristics, in which any void or seam is not produced in a miniaturized interconnect-forming groove and via hole.

In order to accomplish the above-mentioned object, the present invention provides for a method for manufacturing a semiconductor device in which an underlying layer is formed in a contact hole by sputtering and a part of the underlying layer deposited on the bottom surface of the contact hole is at least partially deposited on the lower part of the sidewall surface of the contact hole.

More particularly, a method for manufacturing a semiconductor device according to the present invention comprises: a first step of forming an insulating film including a contact hole on a substrate; a second step of forming a conductive underlying layer on the insulating film inclusive of the sidewall surface and the bottom surface of the contact hole; a third step of subjecting the underlying layer to sputter-etching so that a part of the underlying layer deposited on the bottom surface of the contact hole is at least partially deposited on the lower part of the sidewall surface of the contact hole; and a fourth step of forming a metal layer on the underlying layer by plating.

According to the method for manufacturing a semiconductor device of the present invention, since the film thickness of part of the underlying layer deposited on the lower part of the sidewall surface of the contact hole becomes larger, the underlying layer is continuously deposited also on the lower part of the sidewall surface of the contact hole. Consequently, the coverage of the underlying layer is improved in the lower part of the sidewall surface of the contact hole, and therefore step discontinuity (film break) which is easily caused at the corners of the bottom part of the contact hole can be avoided. In addition, an overhang portion formed at the upper end of the opening of the contact hole can be reduced, thereby ensuring an opening area sufficient to bury the metal layer in the contact hole by plating. As a result, the occurrence of a void or a seam inside the contact hole can be prevented, and the filling characteristics of the metal layer can be improved. Thereby, multilayer interconnects for the semiconductor device can be further miniaturized.

Moreover, when the underlying layer is a barrier layer, a portion of the barrier layer which covers the lower part of the sidewall surface of the contact hole is thickened by sputter-etching and the sidewall surface is uniformly covered. Therefore, interface-diffusion of atoms constituting the metal layer, such as copper atoms, into the insulating film can be suppressed. As a result, the resistance against electro-migration or stress migration can be improved.

Moreover, when the underlying layer is a barrier layer, a portion of the underlying layer on the bottom surface of the contact hole is thinned by sputter-etching. Therefore, the diffusion of metal atoms easily occurs between the metal layer filling in the contact hole and the lower interconnect formed under the metal layer. As a result, the occurrence of a void at the bottom part of the contact hole can be suppressed, thereby improving the resistance against electro-migration. Furthermore, since the underlying layer is thinned, the interconnect resistance can be also reduced.

According to the method for manufacturing a semiconductor device of the present invention, the underlying layer is preferably a plating seed layer made of metal, and the plating seed layer and the metal layer contain copper as a main ingredient.

According to the method for manufacturing a semiconductor device of the present invention, the underlying layer is preferably a barrier layer for preventing atoms constituting the metal layer from diffusing into the insulating film, and the method further comprises, between the third step and the fourth step, a fifth step of forming a plating seed layer made of metal on the barrier layer inclusive of the sidewall surface and the bottom surface of the contact hole.

In this case, said method preferably further comprises, between the fifth step and the fourth step, a sixth step of subjecting the plating seed layer to sputter-etching so that a part of the plating seed layer deposited on the bottom surface of the contact hole is at least partially deposited on the lower part of the sidewall surface of the contact hole.

When the underlying layer is a barrier layer, the plating seed layer and the metal layer preferably contain copper as a main ingredient.

When the underlying layer is a barrier layer, in the third step, a portion of the barrier layer deposited on the bottom surface of the contact hole is preferably removed.

Further, when the underlying layer is a barrier layer, the barrier layer is preferably made of high melting point metal or nitride of the high melting point metal.

In this case, it is preferable that the barrier layer comprises a lower barrier layer made of nitride of high melting point metal and an upper barrier layer made of high melting point metal, and that the second and third steps are performed for each of the lower barrier layer and the upper barrier layer.

DETAILED DESCRIPTION OF THE INVENTION

An embodiment of the present invention will be described with reference to the drawings.

FIGS. 1A and 1B through 6A and 6B illustrate a method for manufacturing a semiconductor device according to an embodiment of the present invention, wherein cross-sectional structures of part of multilayer interconnects including a via hole (contact hole) are shown in the order of process steps.

Figure 1A:
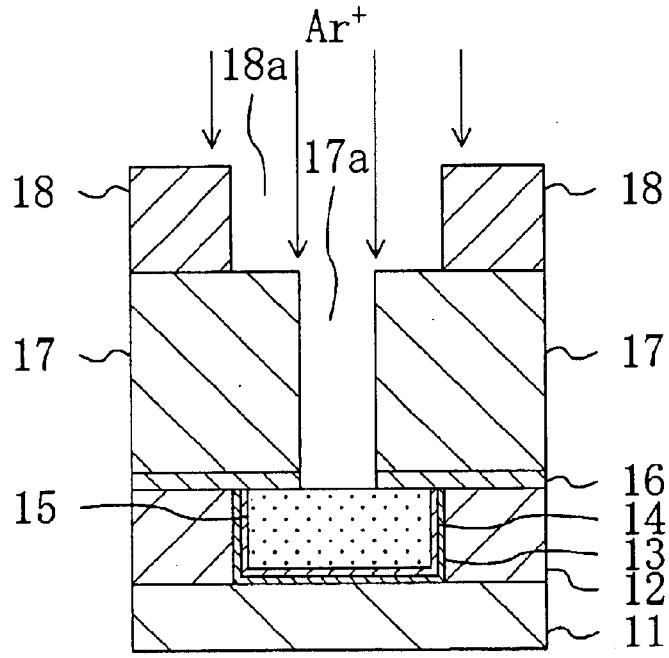
FIGS. 1A and 1B illustrate a method for manufacturing a semiconductor device according to an embodiment of the present invention, and show respective cross-sectional structures of part of multilayer interconnects including a via hole in the order of process steps.

Initially, as shown in FIG. 1A, for example, a first insulating film 11 and a second insulating film 12 which are each made of BPSG (Boron Phosphorous Silicate Glass) obtained by adding boron and phosphorous to silicon oxide are successively deposited on a semiconductor substrate (not shown) made of silicon (Si) by a chemical vapor deposition (CVD) process. Subsequently, a lower-interconnect-forming groove is formed in a predetermined region of the second insulating film 12 by lithography and dry etching. Thereafter, a lower barrier layer 13 made of tantalum nitride (TaN) and an upper barrier layer 14 made of tantalum (Ta) are deposited on the second insulating film 12 over the whole area inclusive of the lower-interconnect-forming groove by sputtering. Subsequently, a plating seed layer (not shown) made of copper (Cu) or an alloy containing copper as a main ingredient is deposited on the upper barrier layer 14 by sputtering. Thereafter, a metal layer made of copper or a copper alloy is deposited on the plating seed layer by electroplating. Then, by chemical mechanical polishing (CMP), parts of the lower barrier layer, the upper barrier layer and the metal layer deposited on the second insulating film 12 are removed, thereby forming a lower interconnect 15 from the metal layer filling in the lower-interconnect-forming groove.

Thereafter, a third insulating film 16 made of silicon nitride ($Si_3N_4$), a fourth insulating film 17 made of BPSG, and a fifth insulating film 18 made of BPSG are successively deposited by CVD, for example. Subsequently, an upper-interconnect-forming groove 18*a* is formed in a region of the fifth insulating film 18 above the lower interconnect 15. Then, a via hole 17*a* exposing the lower interconnect 15 is selectively formed in regions of the third insulating film 16 and the fourth insulating film 17 below the upper-interconnect-forming groove 18*a*. Thereafter, sputter-etching is performed employing argon ($Ar^+$) gas to remove copper oxide or the like as native oxide formed on the surface of the lower interconnect 15 exposed from the via hole 17*a*.

Figure 1B:
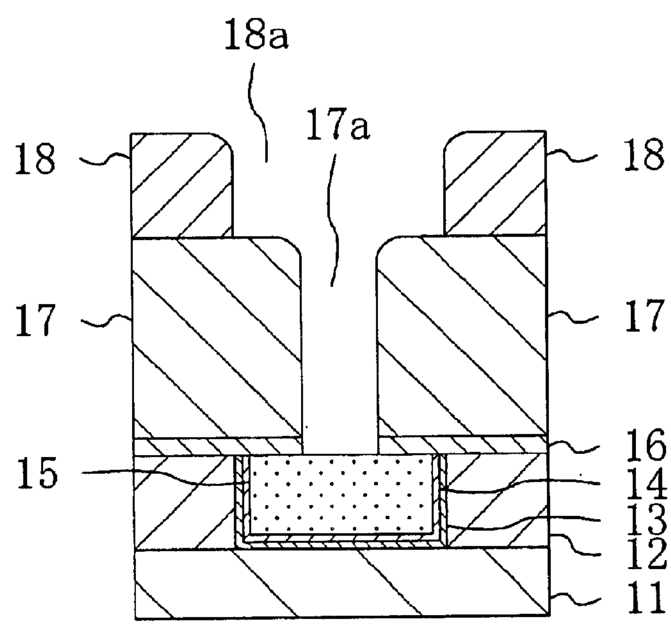

As shown in FIG. 1B, the sputter-etching allows the upper ends of the respective openings of the upper-interconnect-forming groove 18*a* and the via hole 17*a* to be expanded in a rounded manner. Therefore, the areas of openings are also increased after barrier layers and a plating seed layer are deposited in later steps, resulting in excellent filling characteristics of the metal layer in plating.

Figure 2A:
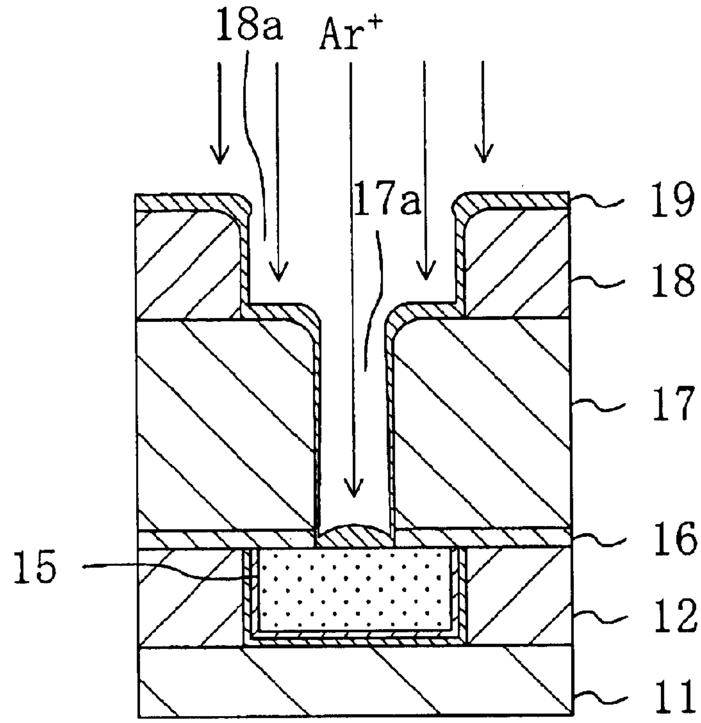
FIGS. 2A and 2B illustrate the method for manufacturing a semiconductor device according to the above embodiment of the present invention, and show respective cross-sectional structures of part of multilayer interconnects including a via hole in the order of process steps.
Figure 2B:
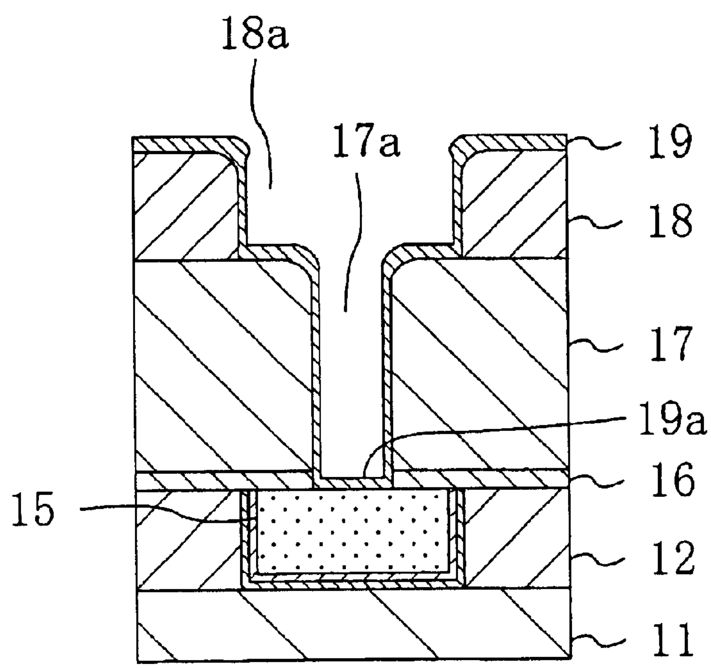

Next, as shown in FIG. 2A, a lower barrier layer 19 made of tantalum nitride having a thickness of approximately 25 nm is deposited by sputtering on the fourth insulating film 17 inclusive of the sidewall surfaces and the bottom surfaces of the via hole 17*a* and the upper-interconnect-forming groove 18*a*. At this time, the sputtering is performed with approximately 10 kW of DC source power applied to a target. Thereafter, the DC source power is reduced to approximately 2 kW, and approximately 200 W of RF power is applied to the semiconductor substrate (sample). Here, the lower barrier layer 19 is subjected to a sputter-etching process employing argon gas at an etching amount of approximately 5 nm. Thereby, as shown in FIG. 2B, a part of the lower barrier layer 19 deposited on the bottom surface of the via hole 17*a* is at least partially deposited on the lower part of the sidewall surface of the via hole 17*a*. The lower barrier layer 19 made of tantalum nitride is provided for the purpose of preventing copper atoms constituting an upper interconnect and a via formed in a later step from diffusing into the fourth insulating film 17 and the fifth insulating film 18. Thereby, the lower barrier layer 19 which prevents the copper atoms from diffusing becomes thicker as its coverage is improved in at least the lower part of the sidewall surface of the via hole 17*a*.

Figure 3A:
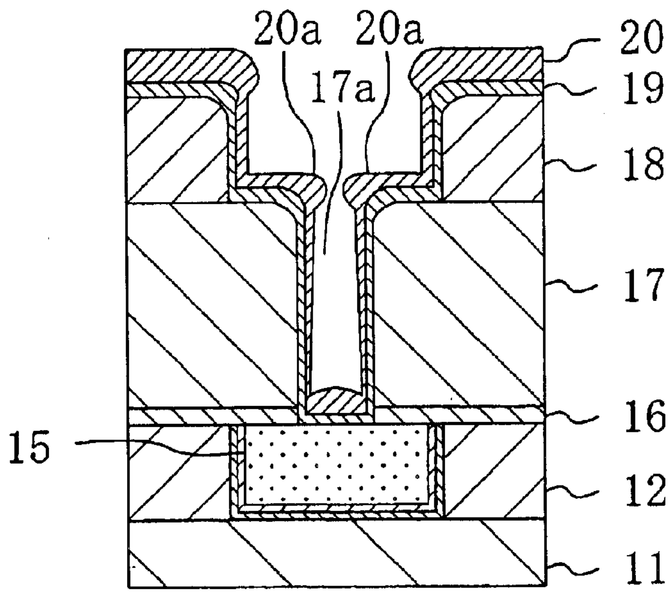
FIGS. 3A and 3B illustrate the method for manufacturing a semiconductor device according to the above embodiment of the present invention, and show respective cross-sectional structures of part of multilayer interconnects including a via hole in the order of process steps.

Next, as shown in FIG. 3A, an upper barrier layer 20 made of β-tantalum (β-Ta) having a thickness of approximately 10 nm is deposited by sputtering on the lower barrier layer 19 inclusive of the sidewall surfaces and the bottom surfaces of the via hole 17*a* and the upper-interconnect-forming groove 18*a*. At this time, the sputtering is performed with approximately 10 kW of DC source power applied to the target as in the lower barrier layer 19. Here, the upper barrier layer 20 made of tantalum is provided as an underlying layer for the plating seed layer formed in a later step. The upper barrier layer 20 allows the adhesion between the plating seed layer and each of the fourth insulating film 17 and the fifth insulating film 18 to be improved. Further, it has been found that β-tantalum has more excellent adhesion to copper (Cu) than that of α-tantalum.

As described above, when the semiconductor device is miniaturized, the aspect ratio of the via hole 17*a* becomes larger. Therefore, in order that each of the lower barrier layer 19 and the upper barrier layer 20 obtains a sufficient thickness of approximately 3 to 5 nm also in the lower part of the sidewall surface of the via hole 17*a*, each layer must be deposited on the upper surfaces of the fourth insulating film 17 and the fifth insulating film 18 to a thickness of 30 to 50 nm. Consequently, as shown in FIG. 3A, an overhang portion 20*a* is formed at the upper end of the opening of the via hole 17*a*, and therefore the opening area of the via hole 17*a* is reduced.

Figure 3B:
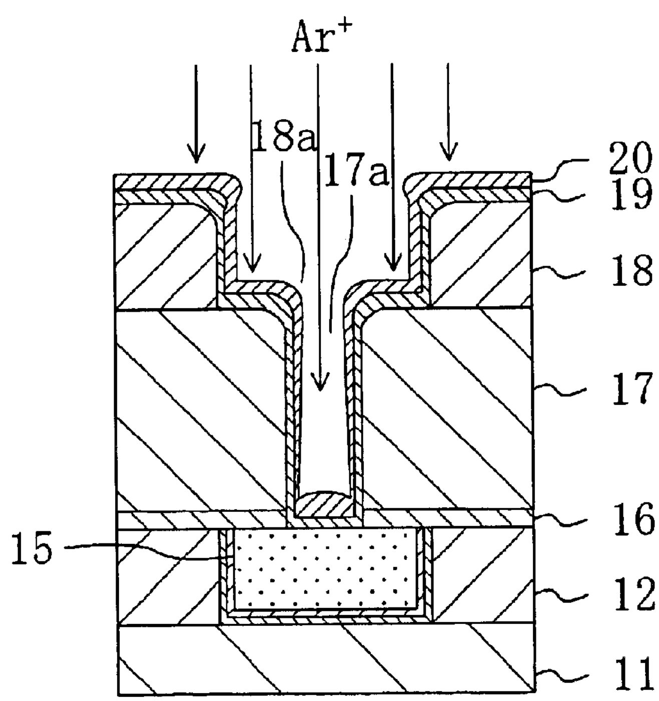
Figure 4A:
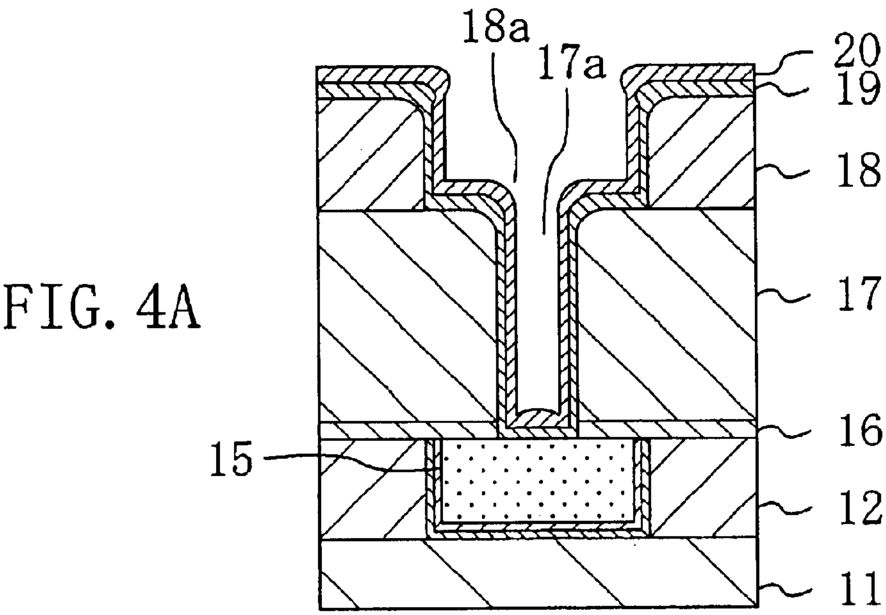
FIGS. 4A and 4B illustrate the method for manufacturing a semiconductor device according to the above embodiment of the present invention, and show respective cross-sectional structures of part of multilayer interconnects including a via hole in the order of process steps.

To cope with this, in the next step shown in FIG. 3B, the DC source power is reduced to approximately 2 kW, and appropriately 200 W of RF power is applied to the semiconductor substrate. Here, the upper barrier layer 20 is subjected to a sputter-etching process employing argon gas at an etching amount of approximately 5 nm. As shown in FIG. 4A, the sputter-etching allows a part of the upper barrier layer 20 deposited on the bottom surface of the via hole 17*a* to be at least partially deposited on the lower barrier layer 19 in the lower part of the sidewall surface of the via hole 17*a*. Thereby, the upper barrier layer 20 as the underlying layer for the plating seed layer becomes thicker as its coverage is improved in at least the lower part of the sidewall surface of the via hole 17*a*.

In this way, according to this embodiment, the coverage of each of the lower barrier layer 19 and the upper barrier layer 20 in the lower part of the sidewall surface of the via hole 17*a* can be improved by the anisotropic sputter-etching process which is performed after deposition. Therefore, even when the initial film thickness of each of the deposited barrier layers 19 and 20 is reduced, the barrier ability of the lower barrier film 19 against copper atoms and the adhesion of the upper barrier layer 20 to the plating seed layer can be ensured.

Moreover, with respect to each of the barrier layers 19 and 20, the sputter-etching process after deposition can also reduce the film thickness of a part of each layer deposited on the upper surfaces of the fourth insulating film 17 and the fifth insulating film 18, and therefore the overhang portion at the upper end of the opening can be reduced. Simultaneously, the film thickness of part of each of the barrier layers 19 and 20 on the bottom surface of the via hole 17*a* can be also reduced, and therefore the via interconnect resistance can be reduced. Accordingly, the sputter-etching is performed for each of barrier layers 19 and 20 to the extent that a portion of each of them on the bottom surface of the via hole 17*a* is removed, thereby further reducing the via interconnect resistance.

Figure 4B:
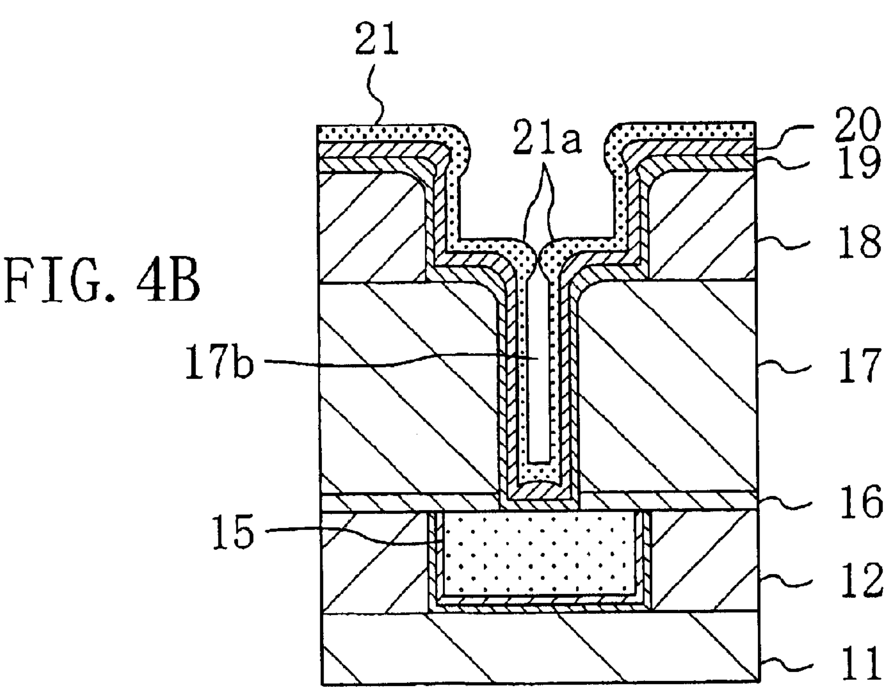
Figure 9A:
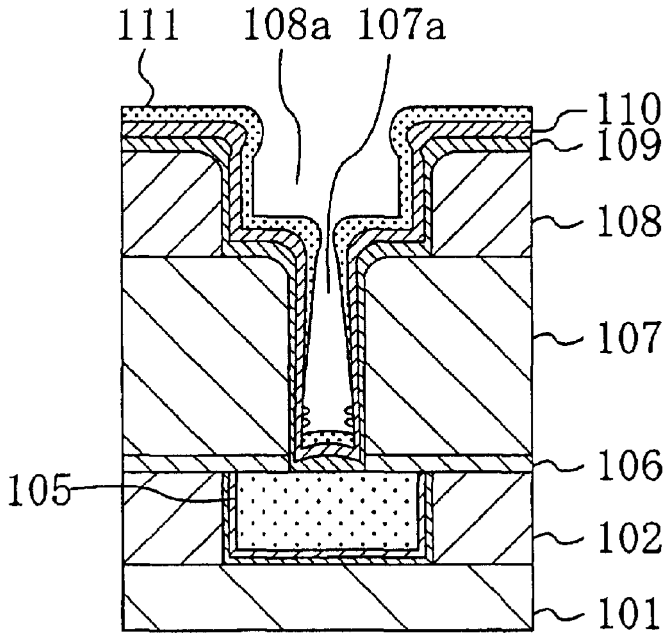
FIGS. 9A and 9B are cross-sectional views showing respective structures of multilayer interconnects in the order of process steps of the known method for manufacturing a semiconductor device, wherein a defect caused in the via hole is shown.
Figure 9B:
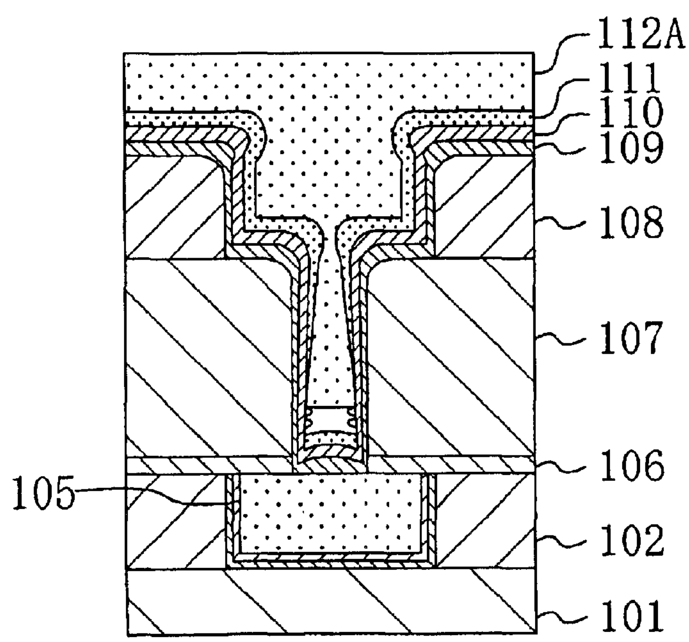
Figure 10A:
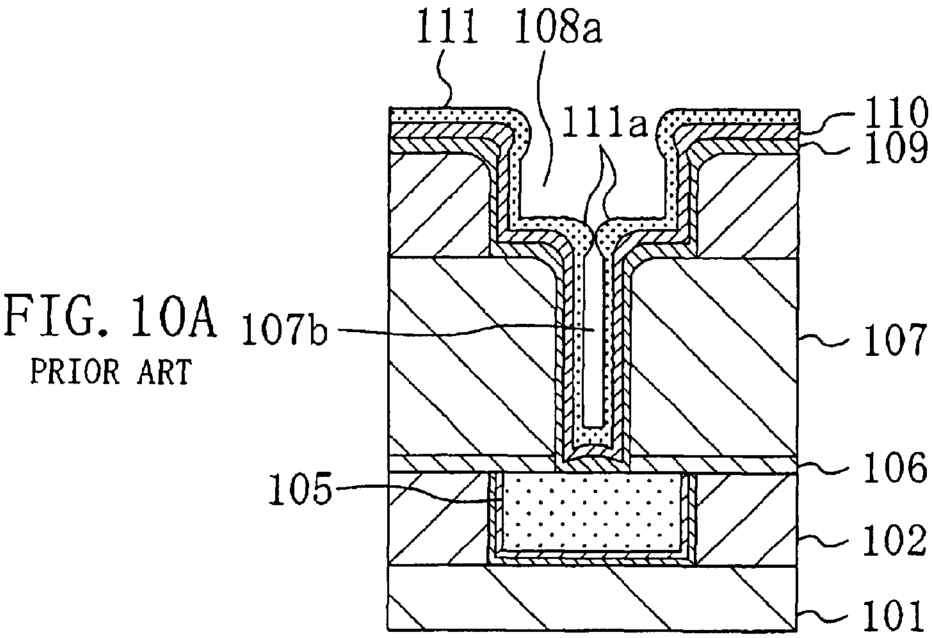
FIGS. 10A and 10B are cross-sectional views showing respective structures of multilayer interconnects in the order of process steps of the known method for manufacturing a semiconductor device, wherein a defect caused in the via hole is shown.
Figure 10B:
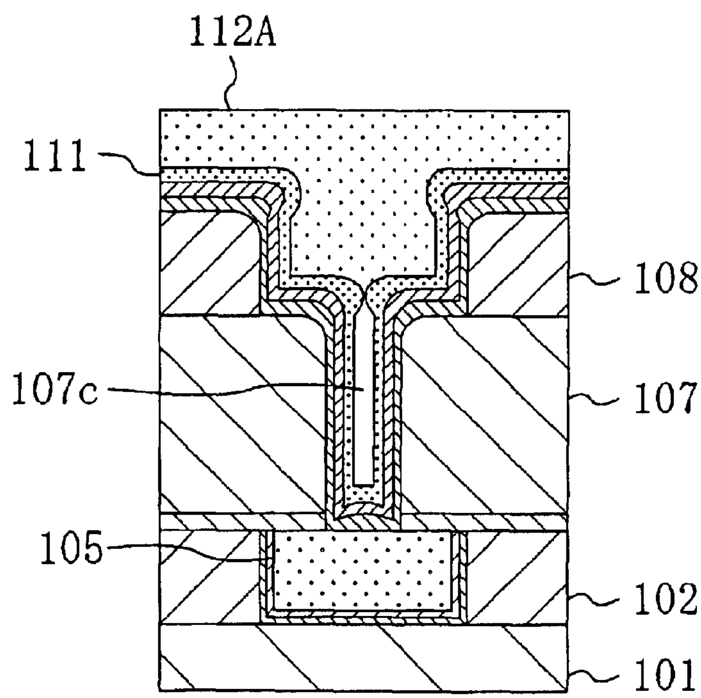

Next, as shown in FIG. 4B, by a sputtering method in which approximately 30 kW of DC source power is applied to the target, a plating seed layer 21 made of copper having a thickness of approximately 100 nm or an alloy containing copper as the main ingredient is deposited on the upper barrier layer 20 inclusive of the sidewall surfaces and the bottom surfaces of the Via hole 17*a*, and the upper-interconnect-forming groove 18*a*. In order that the plating seed layer 21 obtains a sufficient thickness of approximately 10 to 15 nm also in the lower part of the sidewall surface of the via hole 17*a* like the barrier layers 19 and 20, the plating seed layer 21 must be deposited on the fifth insulating film 18 to a thickness of approximately 100 to 150 nm. Consequently, as shown in FIG. 4B, an overhang portion 21*a* is formed at the upper end of the opening of the via hole 17*a*, and therefore the opening area of the via hole 17*a* is reduced. In an extreme case, a seam 17*b* is formed in this step. Further, since the plating seed layer 21 constitutes an underlying layer for copper plating in a later plating step, the plating seed layer 21 must be continuously formed without interruption on the semiconductor substrate. Therefore, if the plating seed layer 21 were not continuously formed, a void or the like would be produced in the lower part of the via hole in the plating step as shown in FIG. 9B.

Figure 5A:
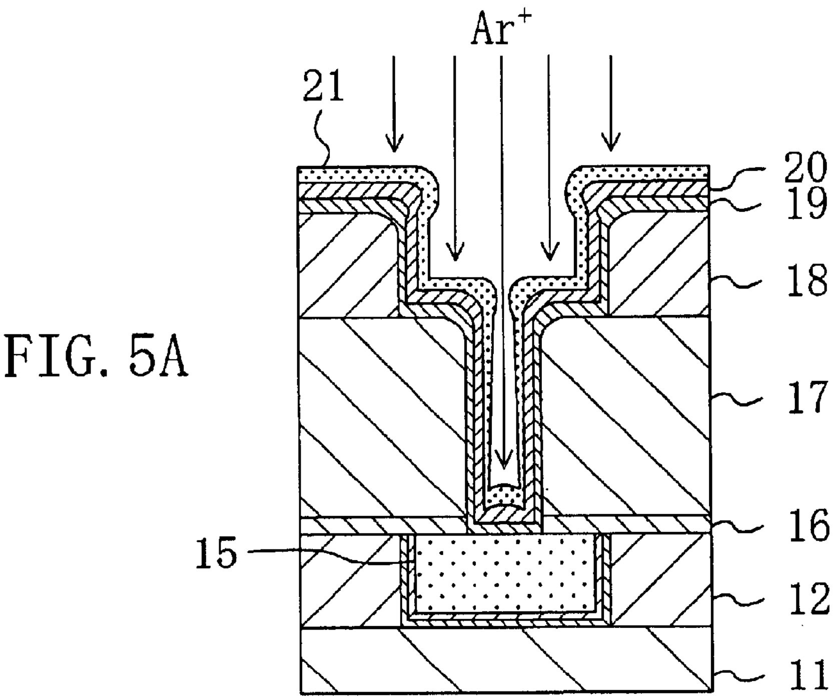
FIGS. 5A and 5B illustrate the method for manufacturing a semiconductor device according to the above embodiment of the present invention, and show respective cross-sectional structures of part of multilayer interconnects including a via hole in the order of process steps.
Figure 5B:
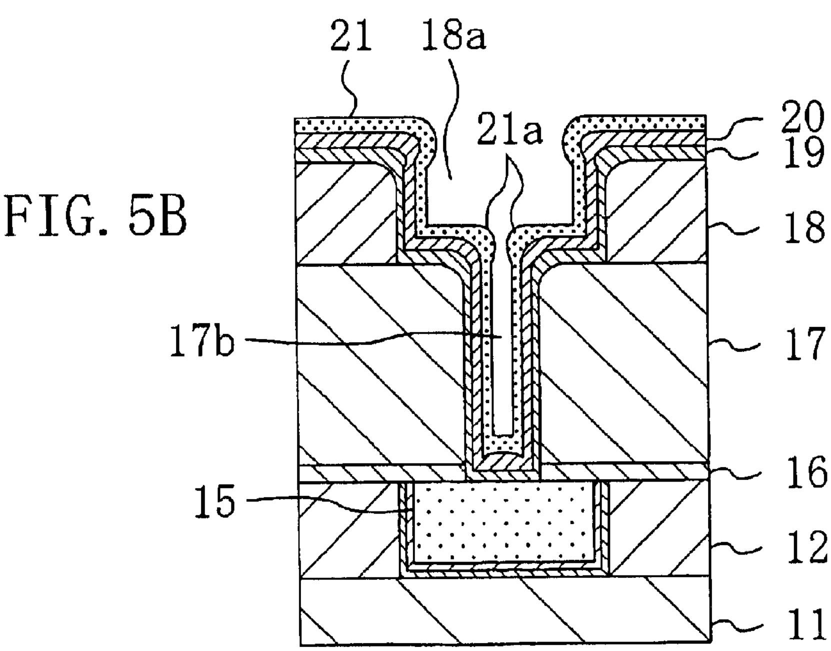

To avoid this, in the next step shown in FIG. 5A, the DC source power is set at approximately 2 kW, and approximately 200 W of RF power is applied to the semiconductor substrate. Here, the plating seed layer 21 is subjected to a sputter-etching process employing argon gas at an etching amount of approximately 50 nm. As shown in FIG. 5B, the sputter-etching allows a part of the plating seed layer 21 deposited on the bottom surface of the via hole 17*a* to be at least partially deposited on the lower barrier layer 19 in the lower part of the sidewall surface of the via hole 17*a*. Thereby, the plating seed layer 21 as the underlying layer for plating has the coverage improved in at least the lower part of the sidewall surface of the via hole 17*a*. Moreover, since the film thickness of each of portions of the plating seed layer 21 located on the fourth insulating film 17 and the fifth insulating film 18 is reduced, the overhanging amount of the overhang portion 21*a* at the upper end of the opening of the via hole 17*a* becomes smaller. As a result, an aperture required for copper plating in a later step can be ensured in the via hole 17*a*.

Figure 6A:
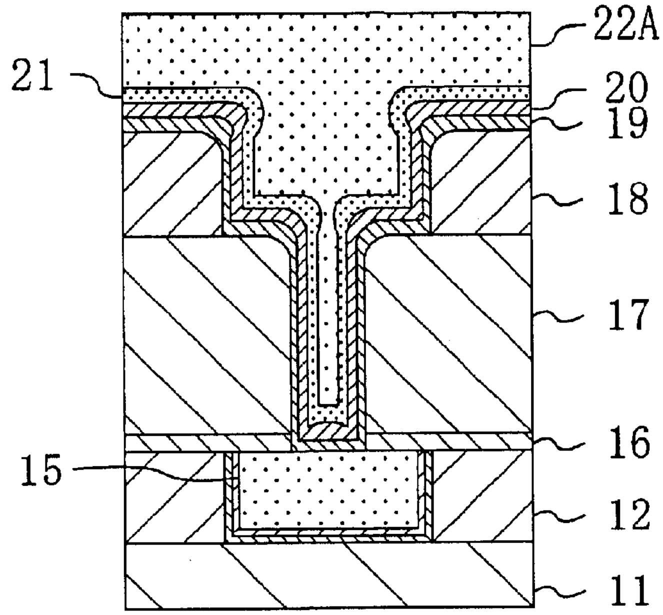
FIGS. 6A and 6B illustrate the method for manufacturing a semiconductor device according to the above embodiment of the present invention, and show respective cross-sectional structures of part of multilayer interconnects including a via hole in the order of process steps.

Next, as shown in FIG. 6A, an upper-interconnect-forming layer 22A made of copper is buried in the via hole 17*a* and the upper-interconnect-forming groove 18*a* by electroplating.

Figure 6B:
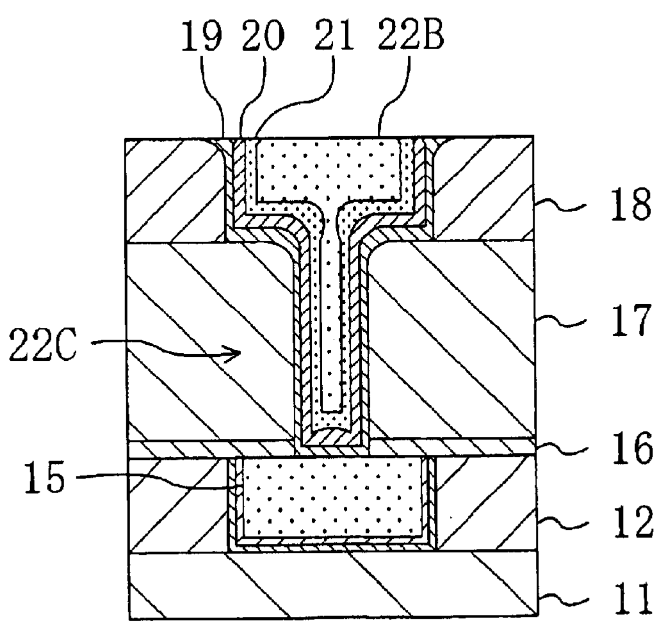
Figure 7A:
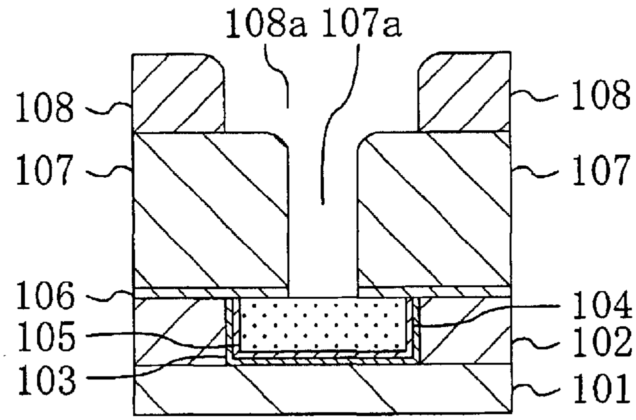
FIGS. 7A through 7C illustrate a known method for manufacturing a semiconductor device, and show respective cross-sectional structures of part of multilayer interconnects including a via hole in the order of process steps.
Figure 7B:
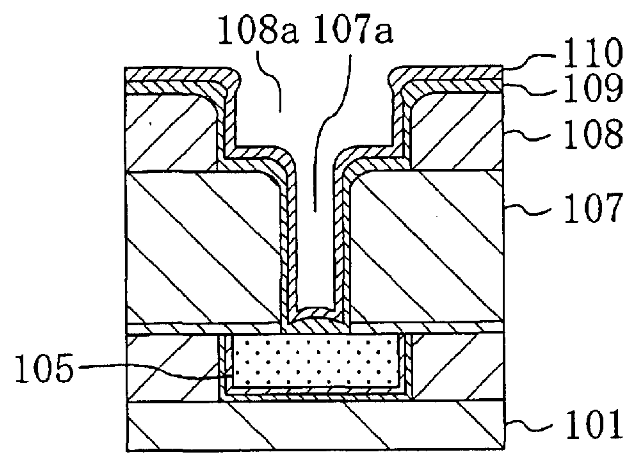
Figure 7C:
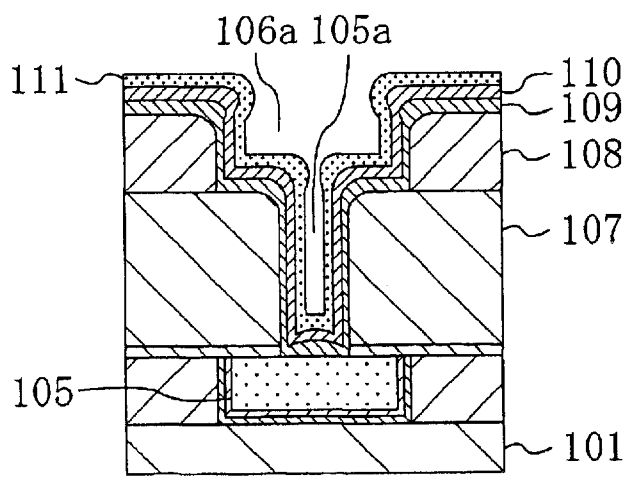
Figure 8A:
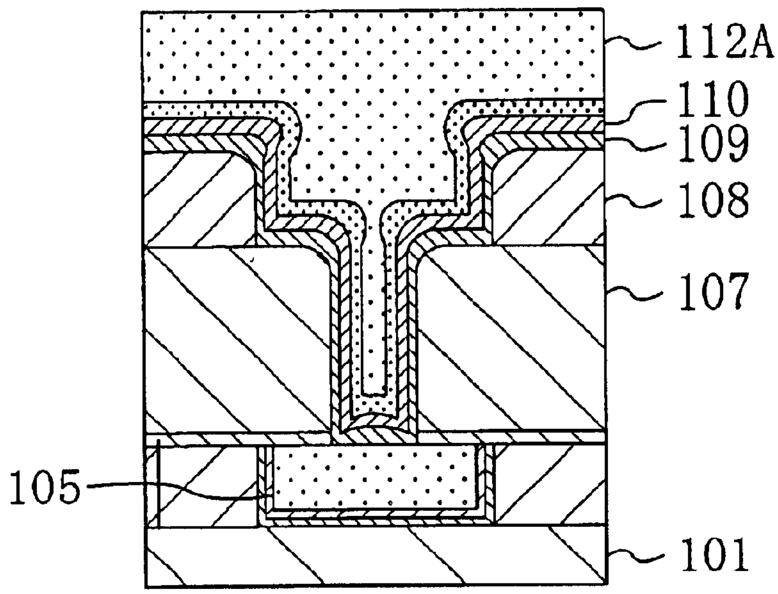
FIGS. 8A and 8B illustrate the known method for manufacturing a semiconductor device, and show respective cross-sectional structures of part of multilayer interconnects including a via hole in the order of process steps.
Figure 8B:
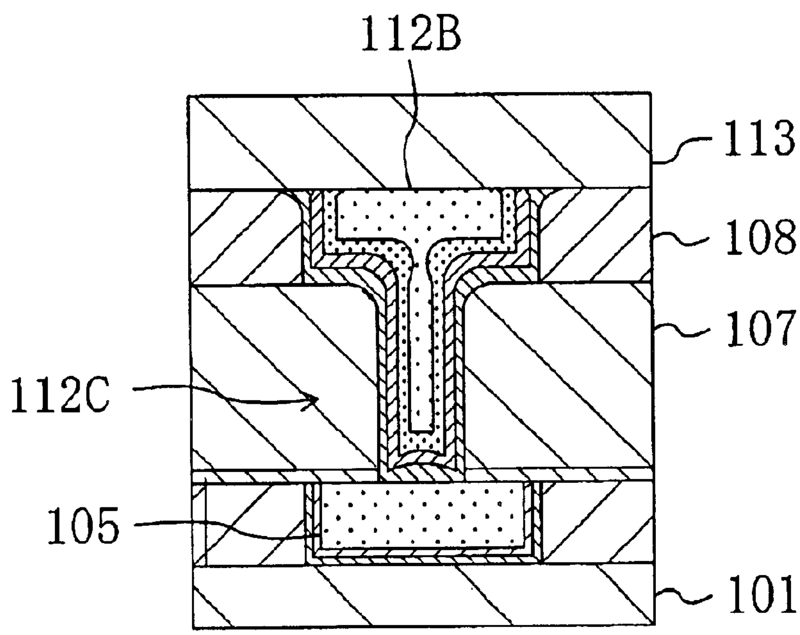

Next, as shown in FIG. 6B, part of the upper-interconnect-forming layer 22A deposited on the fifth insulating film 18 is removed by CMP or the like, and the resultant top surface is planarized, thereby forming an upper interconnect 22B and a via 22C from the upper-interconnect-forming layer 22A made of copper.

While in this embodiment the lower barrier layer 19 and the upper barrier layer 20 interposed between the plating seed layer 21 and both of the fourth insulating film 17 and the fifth insulating film 18 form a laminated structure made of tantalum nitride (TaN) and tantalum (Ta), the present invention is not restricted thereto. For example, the lower barrier layer 19 may be of tungsten nitride (WN), and the upper barrier layer 20 may be of tungsten (W). Alternatively, the other high melting point metals or their nitrides may be employed for the barrier layers. In addition, the barrier layers 19 and 20 are not necessarily required to form a laminated structure.

Moreover, while copper is employed as a metal material constituting the lower interconnect 15, the upper interconnect 22B and the via 22C, the present invention is not restricted thereto, but a metal such as aluminum (Al) or silver (Ag) or an alloy thereof may be employed.

Furthermore, while the lower barrier layer 19, the upper barrier layer 20 and the plating seed layer 21 are deposited by the sputtering method, the present invention is not restricted thereto, but the CVD method may be employed to deposit the layers.

What is claimed is:

1. A method for manufacturing a semiconductor device comprising:

a first step of forming an insulating film including a contact hole on a substrate;

a second step of forming a conductive underlying layer on the insulating film inclusive of the sidewall surface and the bottom surface of the contact hole;

a third step of subjecting the underlying layer to sputter-etching so that a part of the underlying layer deposited on the bottom surface of the contact hole is at least partially deposited on the lower part of the sidewall surface of the contact hole; and a fourth step of forming a metal layer on the underlying layer by plating, wherein in the third step, a film thickness of the underlying layer deposited on the lower part of the sidewall surface of the contact hole increases while a part of the underlying layer remains on the bottom surface of the contact hole.

2. The method for manufacturing the semiconductor device of claim 1 wherein the underlying layer is a plating seed layer made of metal, and the plating seed layer and the metal layer contain copper as a main ingredient.

3. The method for manufacturing a semiconductor device of claim 1 wherein the underlying layer is a barrier layer for preventing atoms constituting the metal layer from diffusing into the insulating film, and the method further comprises, between the third step and the fourth step, a fifth step of forming a plating seed layer made of metal on the barrier layer inclusive of the sidewall surface and the bottom surface of the contact hole.

4. The method for manufacturing a semiconductor device of claim 3, said method further comprising, between the fifth step and the fourth step, a sixth step of subjecting the plating seed layer to sputter-etching so that a part of the plating seed layer deposited on the bottom surface of the contact hole is at least partially deposited on the lower part of the sidewall surface of the contact hole, wherein in the sixth step, a film thickness of the plating seed layer deposited on the lower part of the sidewall surface of the contact hole increases while a part of the plating seed layer remains on the bottom surface of the contact hole.

5. The method for manufacturing a semiconductor device of claim 4, wherein in the sixth step, an overhang portion of the plating seed layer at the upper end of an opening of the contact hole decreases while the film thickness of the plating seed layer deposited on the lower part of the sidewall surface of the contact hole increases.

6. The method for manufacturing a semiconductor device of claim 4, wherein in the sixth step, the contact hole is uniformly covered with the plating seed layer while the film thickness of the plating seed layer deposited on the lower part of the sidewall surface of the contact hole increases.

7. The method for manufacturing a semiconductor device of claim 4, wherein in the fifth step, the plating seed layer is deposited by a sputtering method in which DC source power is applied to a target, and in the sixth step, the DC source power is reduced, RE power is applied to the substrate, and a sputter-etching process employing argon gas is performed to the plating seed layer.

8. The method for manufacturing a semiconductor device of claim 3 wherein the plating seed layer and the metal layer contain copper as a main ingredient.

9. The method for manufacturing a semiconductor device of claim 3 wherein in the third step, a portion of the barrier layer deposited on the bottom surface of the contact hole is removed.

10. The method for manufacturing a semiconductor device of claim 3 wherein the barrier layer is made of high melting point metal or nitride of the high melting point metal.

11. The method for manufacturing a semiconductor device of claim 3 wherein the barrier layer comprises a lower barrier layer made of nitride of high melting point metal and an upper barrier layer made of high melting point metal, and the second and third steps are performed for each of the lower barrier layer and the upper barrier layer.

12. The method for manufacturing a semiconductor device of claim 1, wherein in the third step, an overhang portion of the underlying layer at the upper end of an opening of the contact hole decreases while the film thickness of the underlying layer deposited on the lower part of the sidewall surface of the contact hole increases.

13. The method for manufacturing a semiconductor device of claim 1, wherein in the third step, the contact hole is uniformly covered with the underlying layer while the film thickness of the underlying layer deposited on the lower part of the sidewall surface of the contact hole increases.

14. The method for manufacturing a semiconductor device of claim 1, wherein in the second step, the underlying layer is deposited by a sputtering method in which DC source power is applied to a target, and in the third step, the DC source power is reduced, RF power is applied to the substrate, and a sputter-etching process employing argon gas is performed to the underlying layer.

* * * * *

UNITED STATES PATENT AND TRADEMARK OFFICE

CERTIFICATE OF CORRECTION

PATENT NO. : 6,951,809 B2
APPLICATION NO. : 10/613048
DATED : October 4, 2005
INVENTOR(S) : Nobuaki Tarumi et al.

It is certified that error appears in the above-identified patent and that said Letters Patent is hereby corrected as shown below:

Column 9, line 7-8, change “RE power” to --RF power--.

Signed and Sealed this

Seventh Day of November, 2006

JON W. DUDAS

*Director of the United States Patent and Trademark Office*